United States Patent [19]

Ehrfeld et al.

[11] Patent Number: 5,376,507
[45] Date of Patent: Dec. 27, 1994

[54] METHOD TO PRODUCE NONLINEAR OPTICAL MICROCOMPONENTS

[75] Inventors: Wolfgang Ehrfeld, Mainz; Herbert O. Moser, Karlsruhe; Klaus Mullen, Mainz; Christoph Bubeck, Eltville; Hans-Dieter Bauer, Partenheim, all of Germany

[73] Assignee: IMM, Institut fur Mikrotechnik GmbH, Mainz, Germany

[21] Appl. No.: 2,822

[22] Filed: Jan. 8, 1993

[30] Foreign Application Priority Data

Jan. 10, 1992 [DE] Germany ............................. 4200396

[51] Int. Cl.⁵ ............................................. G02B 6/10
[52] U.S. Cl. .................................. 430/321; 264/1.27; 264/2.5; 385/122; 430/967
[58] Field of Search ......................... 430/321, 967, 326; 385/5, 16, 130, 132, 143, 145, 122; 264/1.4, 1.5, 2.5

[56] References Cited

U.S. PATENT DOCUMENTS

| 4,351,653 | 9/1982 | Becker et al. | 55/394 |
|---|---|---|---|
| 4,775,215 | 10/1988 | Teng et al. | 385/143 |
| 4,784,935 | 11/1988 | Ehrfeld et al. | 430/321 |
| 4,805,975 | 2/1989 | Utaka et al. | 385/122 |
| 5,106,211 | 4/1992 | Chiang et al. | 385/132 |
| 5,210,801 | 5/1993 | Fournier et al. | 385/14 |
| 5,230,990 | 7/1993 | Iwasaki et al. | 430/321 |
| 5,253,319 | 10/1993 | Bhagavatula | 385/129 |
| 5,260,175 | 11/1993 | Kowanz et al. | 430/326 |

FOREIGN PATENT DOCUMENTS

| 445527 | 9/1991 | European Pat. Off. . |
|---|---|---|
| 3611246 | 10/1987 | Germany . |
| 3909449 | 11/1990 | Germany . |
| 60-232509 | 11/1985 | Japan . |
| 61-167930 | 7/1986 | Japan . |

OTHER PUBLICATIONS

Physik-Verlag GmbH, Phys. Bl. 46 (1990), "Licht steuert Licht—Photonik," Von F. Mitschke, pp. 463–469.

Physik-Verlag GmbH, Phys. Bl. 40 (1984) Nr. 6, "Optische Bistabilitat: Ein Weg Zum optischen Computer?", Von A. Dorsel & P. Meystre, pp. 143-148.

Technishes Messen Sonderheft zur Sensor '91, 58 (1991) 4, pp. 152-157, supplied in the form of 27 pages of 8½×11″ text, stapled.

Spektrum der Wissenschaft, Dec. 1986, pp. 116-128, title, "Werkstoffe fur die Photonik". Author-Von J. M. Rowell.

Elsevier Science Publishers B.V. (North-Holland), Nuclear Instruments and Methods in Physics Research A303 (1991), pp. 523-531, "Three-dimensional microfabrication using synchrotron radiation".

Primary Examiner—Janet C. Baxter
Assistant Examiner—John A. McPherson
Attorney, Agent, or Firm—H. Gibner Lehmann; K. Gibner Lehmann

[57] ABSTRACT

A method to produce nonlinear optical microcomponents is described which employs hitherto not yet used material combinations. Not only waveguide structures are produced by means of X-ray depth lithography, but also microcell structures, into which materials having nonlinear optical properties are introduced. The microstructure is produced as a positive mold part, from which there is subsequently generated, by means of electroforming, a mold insert, a negative of which is made using a polymer material. After the molding operation the microstructure is applied to a substrate, and nonlinear optical material, covered by a cover plate if needed or desired, is introduced into the microcell structure.

14 Claims, 4 Drawing Sheets

METHOD TO PRODUCE NONLINEAR OPTICAL MICROCOMPONENTS

CROSS REFERENCES TO RELATED APPLICATIONS

The present application claims priority under 35 USC 119, of German Application No. P 42 00 396.2-51 filed Jan. 10, 1992, entitled "Verfahren zur Herstellung yon nicht linearen optischen Mikrobauelementen", and having common ownership with the present application.

Reference is also made to applicants' German Application No. P 42 00 397.0-51, filed Jan. 10, 1992, entitled "Verfahren zur Herstellung yon nicht linearen optischen Mikrobauelementen", and having common ownership with the present application.

Also, U.S. Ser. No. 08/001,194, filed Jan. 7, 1993, and which claims priority of German Application No. P 42 00 397.0-51.

STATEMENT AS TO RIGHTS TO INVENTIONS MADE UNDER FEDERALLY-SPONSORED RESEARCH AND DEVELOPMENT

Research and development of the present invention and application have not been Federally-sponsored, and no rights are given under any Federal program.

BACKGROUND OF THE INVENTION

FIELD OF THE INVENTION

This invention relates to a method to make nonlinear optical components by which a waveguide structure is produced first from a multilayer resist material, using X-ray depth lithography, and by which the free spaces thereby created are filled out with a filler material corresponding to the outer layer of the multilayer resist material. The invention also relates to methods according to the preambles of claims 5 and 6.

DESCRIPTION OF THE RELATED ART INCLUDING INFORMATION DISCLOSED UNDER 37 CFR §§1.97-1.99

Optical microcomponents are used in optical miniature circuits in which light signals can be generated, conducted in a plane through waveguides and processed as well as verified. The most important substrate materials so far for producing integrated optical components are glass, lithium niobate and silicon. The class of the 3-5 semiconductor materials has gained great importance, particularly for the monolithic integration of passive waveguide structures and optoelectronic components.

Known from "Technisches Wissen, Special Issue on Sensor 91" 58 (1991) 4, pages 152 to 157, is a method to produce optical microcomponents in which wafers are cut off a glass rod. The subsequent photolithographic process starts with producing a suitably structured primary mask on an electron-beam recorder, which mask is copied by the direct contact method on the previously metal-and-photosensitive-resist-coated glass wafer. After the development of the resist and etching out the metal layer in the open resist areas, the desired waveguide structure is present as a metal mask. To generate the waveguides, the glass wafers are immersed in a hot, molten salt bath wherein metal ions from the melt, driven by concentration gradients, penetrate the glass surface through the mask openings, increasing the refraction index there. After removal of the mask, individual chips are sawed out of the glass wafer and their faces polished for the later fiber coupling. The maximum refraction index of waveguides produced in this manner is directly on the glass surface.

Shielding the guided light waves succeeds by burying the extraneous ions under the substrate surface in a second exchange step which can be both diffusion-controlled (thermal) and drift-controlled (field supported).

To produce a nonlinear optical microcomponent on the basis of lithium niobate, a lithium niobate monocrystal is produced first—as described in "Spektrum der Wissenschaft" December 1986, page 116 ff—to whose surface is applied a thin titanium film by means of photolithography and also a mask to impart to the monocrystal the desired waveguide structure. Then the entire arrangement is heated to about 1000° C. so that the titanium is applied to the outermost surface of the lithium niobate. The remaining titanium is etched away.

The disadvantage of these methods is that the choice of materials to produce nonlinear optical components is limited. In particular, the combination of optically linear and optically nonlinear material is not realizeable in the desired variety. Beyond this, these methods are too costly for the mass production of nonlinear optical microcomponents.

In order to open up polymer materials for the application of waveguides in microcomponents, X-ray depth lithography has been already used in the past (see e.g. DE-PS 36 11 246). From a multilayer resist material whose core layer consists of a light conducting polymer it is possible to produce, by means of X-ray depth lithography, waveguide structures, with the free spaces to delineate the waveguide structure being filled out with material of the outside layer. X-ray depth lithography also makes it possible to produce mold inserts, by means of which optically linear components can be produced by known molding techniques.

SUMMARY OF THE INVENTION

The object of this invention is to make available a method by which nonlinear optical microcomponents can be produced, making possible the application of hitherto not yet used material combinations, in particular the combination of polymers with linear optical properties and those with nonlinear optical properties. In addition, the method is inexpensive so as to make mass production possible.

This problem is solved by the methods according to claims 1 5 and 6. Advantageous embodiments are the subject of the subclaims.

The invention is based on the knowledge that it is possible by means of X-ray depth lithography to produce not only waveguide structures, but also microcell structures, into which is placed material having nonlinear optical properties.

According to a first embodiment, a waveguide structure is produced first from a multilayer resist material by means of X-ray depth lithography, and the free spaces generated thereby a filled with a filler material. Preferably, this filler material consists of the same material as the outside layer of the multilayer resist material so that the light conducting core layer is surrounded all around by outside layer material except for the input and output gaps. Then, depending on the structure of the optical microcomponent, there is produced, at least in the area of the waveguide structure, at least one microcell which is subsequently filled with material having nonlinear optical properties.

Preferably, when producing the microcell structure, the waveguide ends connecting to the microcell are structured at the same time. In particular, the end surfaces of the light waveguides can be of curved design due to this structuring, or they can be provided with defractive structures, by means of which the light energy current density can be increased or decreased.

If a multilayer resist material is used, a three-layer resist material consisting, according to a preferred embodiment, of PMMA with outside layers of fluoridated PMMA is recommended in particular.

According to another embodiment of the invention, there is produced from a resist material, by means of X-ray depth lithography, a microstructure containing a waveguide structure and at least one microcell structure, from which is subsequently generated, by means of electroforming, a mold insert which is molded from a polymer material. After the molding operation, the microstructure is applied to a substrate, and an optically nonlinear material is placed into the microcell structure. The use of a mold insert offers the possibility of using, in the first step of the process, a resist material suited for X-ray depth lithography and then, in the molding step, employing a second polymer material which is characterized by the desired optical properties.

If a resist material is already used in the first step of the process which is both suited for X-ray depth lithography and also has the desired optical properties, it is unnecessary to produce a mold insert, and material having optically nonlinear properties is placed directly into the microcell structure created.

The nonlinear optical material is preferably a polymer also. Suitable materials are polyphenylvinylene (PPV), polyphenylacetylene (PPA), and polynaphthylenevinylene (PNV).

The optically nonlinear material may be a liquid polymer which remains in liquid state after having been introduced into the microcell structure.

The liquid, optically nonlinear material is locked in by a cover layer. Suited as cover layer is glass, for instance.

After having been placed into the microcell structure, the optically nonlinear material may be stabilized by means of a low temperature plasma treatment or suitable radiation. In this case, a cover layer becomes unnecessary.

Instead of filling the microcell structure with a liquid polymer, a solid having nonlinear properties may also be inserted into the microcell structure. Suitable for this purpose are crystals, such as of barium titanate. In such cases, the nonlinear optical solid may also be applied to the substrate first, and the microcell structure produced by the method according to the invention placed on the substrate subsequently so as to enclose the nonlinear optical solid.

The entire microstructure is preferably provided with a cover layer consisting of glass or having glass as a component. Both the substrate and the cover layer or cover plate preferably have a refraction index smaller than that of the nonlinear optical material or the material forming the microcell structure.

To make it possible, if required or desired, to influence the optical properties through an electrical field, electrodes are provided in the area of the nonlinear optical material. This can be accomplished in that a metal film for the first electrode is applied to the substrate in the area of the nonlinear optical material and a second metal film for the second electrode after the nonlinear optical material is in place. Another possibility is to provide the cover layer with an appropriate metallic coating before it is applied. If the nonlinear optical material is a solid, it can be provided with an appropriate, electrically conductive coating before it is put into the microcell structure.

Since the use of X-ray depth lithography imposes no limits to the physical design of the waveguide structures and the microcell structures, a great variety of microcomponents, such as coupling capacitors, gates or switches can be produced. Beyond this, different polymer materials can be combined with one another, making it possible, due to the better optical properties of these materials, to produce optical microcomponents of improved output. The production times for the microcomponents are shorter than for those made by the methods according to the state of the art. In particular, the process variant employing a mold insert is suited for mass production because the mold insert is reusable repeatedly, with no quality losses being detectable.

Other features and advantages will hereinafter appear.

BRIEF DESCRIPTION OF THE DRAWINGS

Embodiment examples of the invention are explained in greater detail below with reference to the drawings which illustrate the manufacture of a microswitch.

DESCRIPTION OF THE PREFERRED EMBODIMENT

Figure 1:
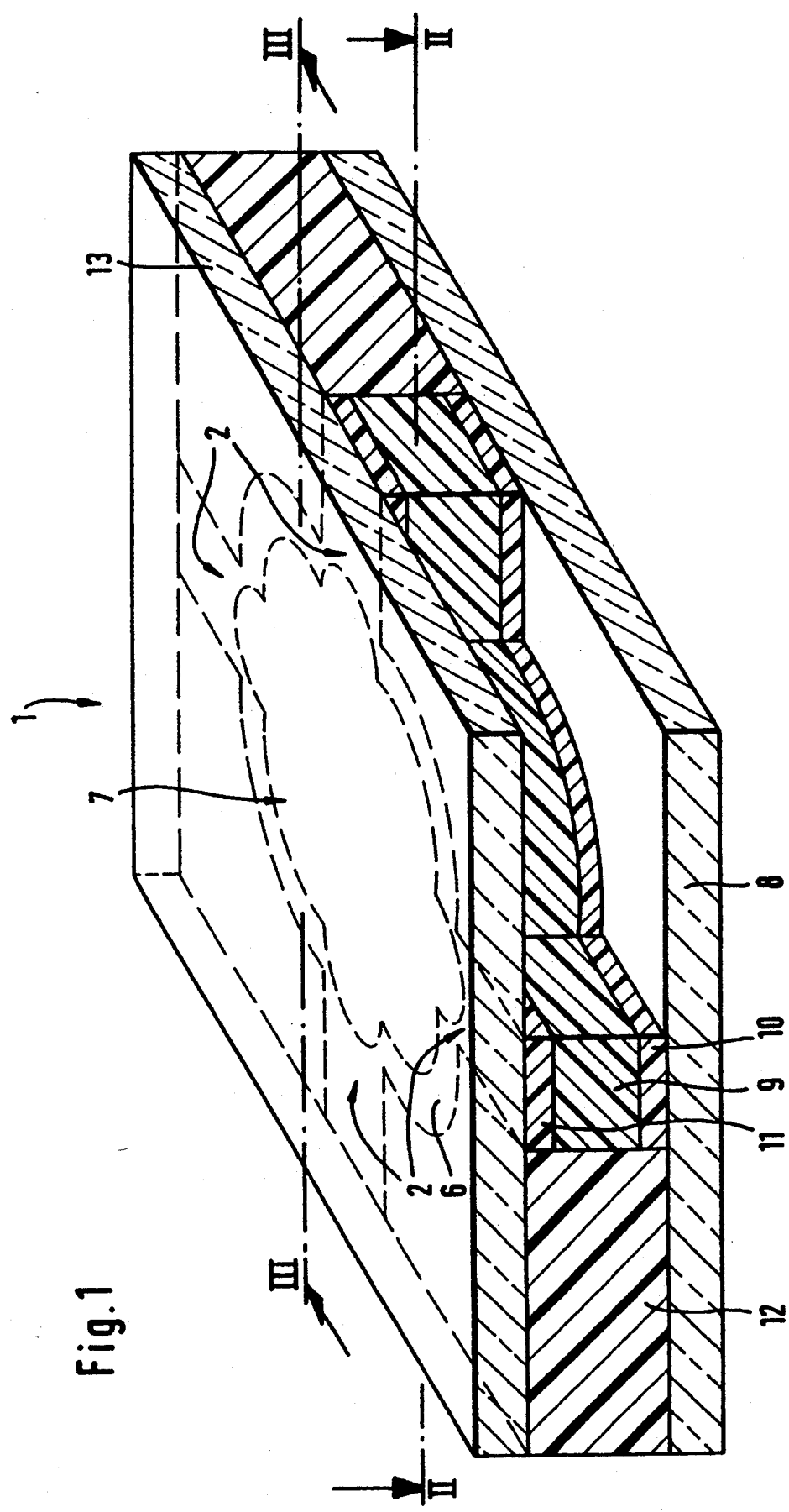
FIG. 1 shows the perspective view of a microcomponent in the form of a switch.
Figure 2:
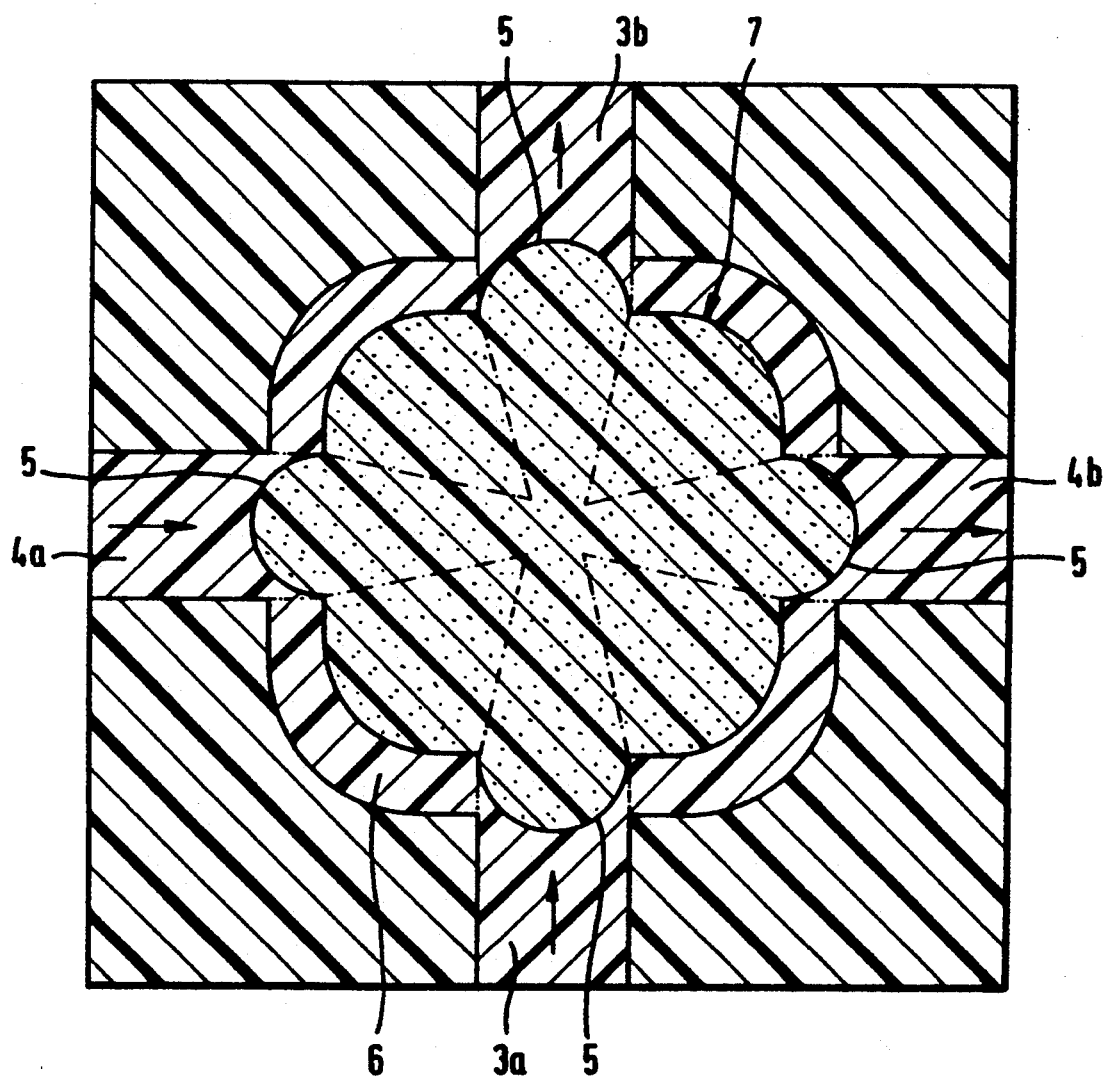
FIG. 2 is a section along line II—II of the switch shown in FIG. 1.

Shown perspectively in FIG. 1 is an integrated, optical microswitch 1, the central area of the microcomponent 1 having been left out in the front right corner to show the microstructure more clearly. As may be seen particularly in FIG. 2, the microswitch 1 contains a waveguide structure 2 in the form of two intersecting waveguides 3a, 3b and 4a, 4b. In the area where the waveguides 3, 4 intersect there is a central area 6 made of the same material as the waveguide 3, 4 and containing a microcell structure 7 filled out with optically nonlinear material. The light waveguide ends 5 abutting the microcell structure are of curved design to focus the light—as shown in FIG. 2. The transparency of the optically nonlinear material within the microcell structure 7 can be controlled through the light intensity fed in e.g. through the light waveguide 4a so that the light conducted by the light waveguide 3a, 3b can be switched.

As may be seen in FIG. 1, there is on a substrate 8 a three layer resist material which forms the waveguide structure 2 and the central area 6 and consists of a core layer 9, a lower outside layer 10 and an upper outside layer 11. The core layer 9 consists of PMMA while the outside layers 10 and 11 as well as the filler material 12 surrounding the waveguide structure 2 consist of fluoridated PMMA. The entire waveguide structure 2 and the microcell structure 7 are both covered by a cover layer 13 which, like the substrate 8, may consist of glass.

The manufacture of such an optical microcomponent 1 is described in detail in the following, the FIGS. 3a to 3e illustrating the manufacturing steps relative to a section along line III—III in FIG. 1.

The starting material for the microcomponent 1 is the three layer resist material which is located on the substrate 8 and is radiated by X-rays 14, using a first mask 15 which contains the waveguide structure, including the structure of the central area.

The radiated areas are subsequently removed to form the free spaces 17 and 18 (see FIG. 3b) and then filled with filler material 12 which consists of the same material as the lower outside layer 10 or the upper outside layer 11. If necessary or desired, the surfaces of the waveguide structure and of the outside layers 10 and 11 must first be cross-linked by UV radiation. As may be seen in FIG. 3c, the element thus prepared is likewise radiated with X-rays 14, using a second mask 16 which contains the microcell structure 7.

Figure 3A:
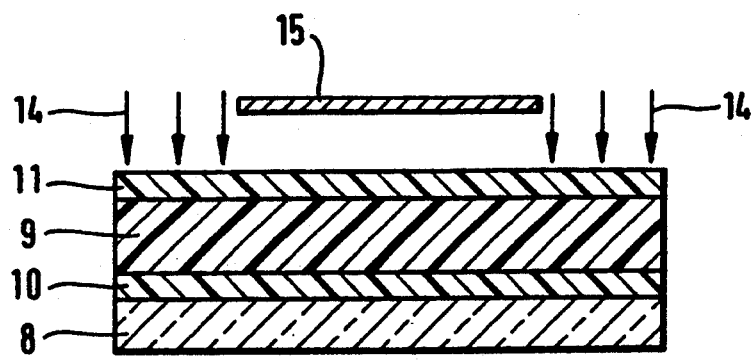
FIGS. 3a–3e show the manufacturing steps according to one embodiment of the method, relative to a section along line III—III of the switch shown in FIG. 1, and FIGS. 4a–4f show the manufacturing steps according to another embodiment.
Figure 3B:
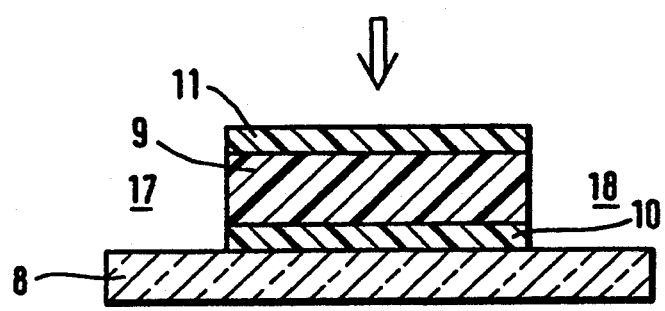
Figure 3C:
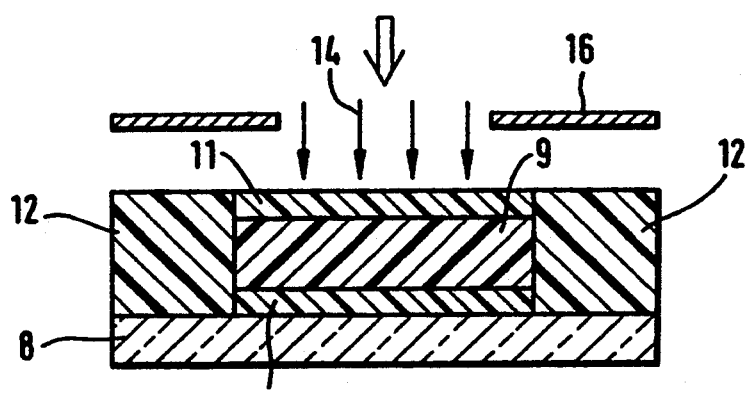
Figure 3D:
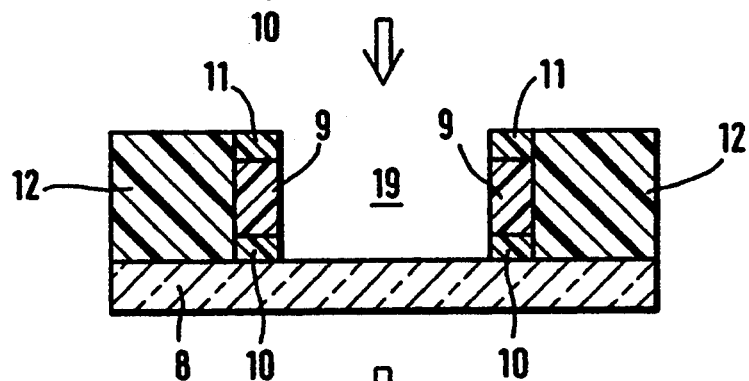
Figure 3E:
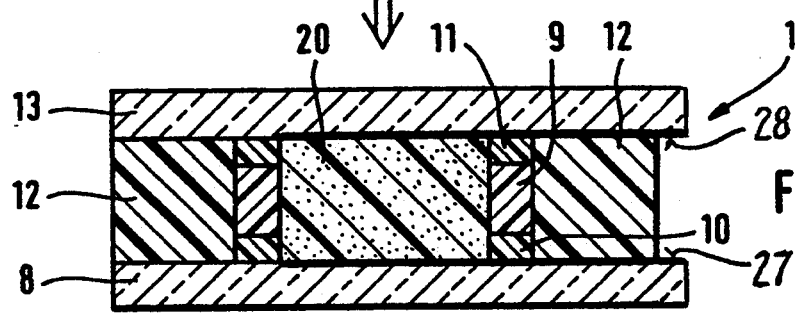
Figure 4A:
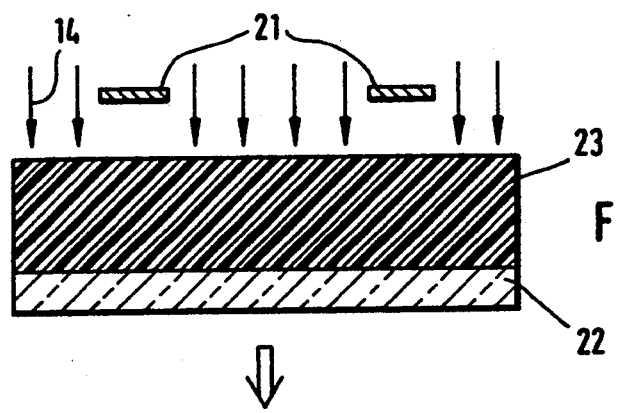
Figure 4B:
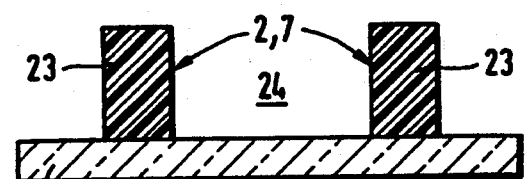
Figure 4C:
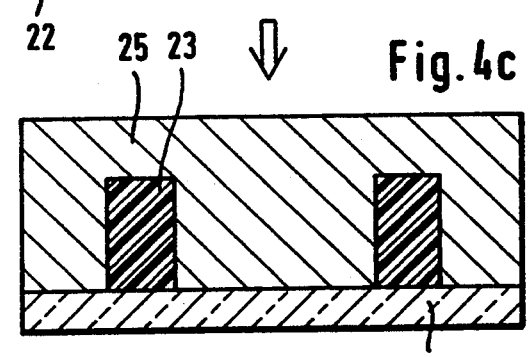
Figure 4D:
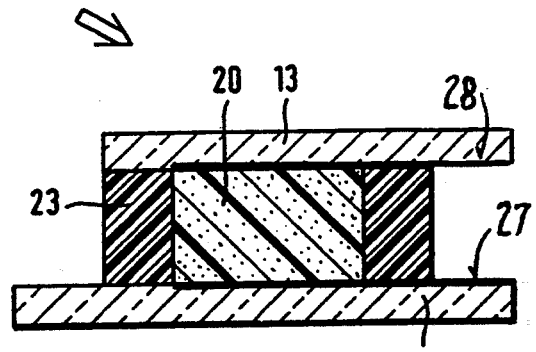
Figure 4E:
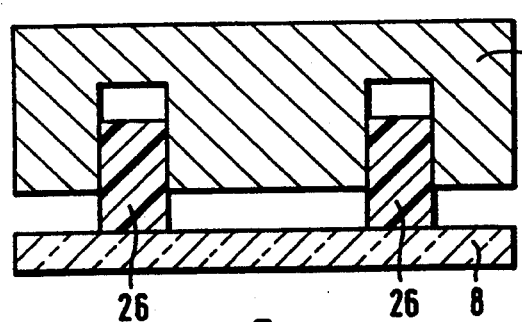
Figure 4F:
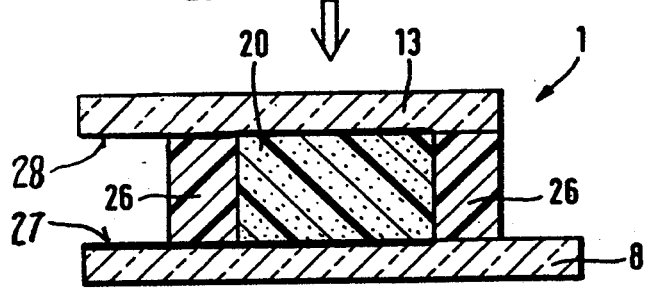

As shown in FIG. 3d, the radiated areas are again removed so that another free space 19 is formed which contains the microcell structure 7. In another operation shown in FIG. 3e, this free space 19 is filled with optically nonlinear material, and the cover layer 13 is then applied.

FIGS. 4a to 4f show the manufacturing steps of another embodiment of the method according to the invention. A resist material 23, radiated by X-rays 14 using a mask 21 is located on a substrate 22. The mask 21 has the structure of the later waveguides and the microcell structure. After the radiation and the removal of the radiated areas, the remaining resist material 23 forms the waveguide structure 2 and the microcell structure 7.

If the resist material 23 already is a material which also has the desired optical properties for the formation of waveguides, only the free space 24 need be filled with nonlinear material 20 to complete the desired microcomponent 1. Depending on whether the nonlinear material is liquid or solid, the entire structure may yet be provided with a cover layer 13.

If the resist material 23 does not have the desired optical properties, a mold insert 25 is produced by means of electroforming. This is shown schematically in FIG. 4c. The mold insert 25 then has a microstructure which includes both the waveguide structure 2 and the microcell structure 7. These structures are molded of another polymer material 26 which has the desired optical properties. After completing the manufacturing step illustrated in FIG. 4e, the microcell structure 7 is filled with nonlinear material 20 and a cover layer 13 is applied if needed or desired.

In order to make the molded structure into a light waveguide here, too, both the substrate 8 and the cover plate 13 have a refraction index smaller than that of the polymer material 26. This can be achieved, for example, in that the substrate 8 and the cover plate 13 each consist of two layers, where the inner layer facing the microcomponent may consist of precrosslinked, fluoridated PMMA, for example, and the outer layer of glass or phenolic resin.

Preferably electrodes 27, 28 are provided on the substrate 8 or 22 and cover plate, respectively. The bottom electrode 27 is evaporated or sputtered directly onto the upper side of the substrate 8 or 22 as a thin metal layer. If necessary, it can be structured by photolithographic means. The top electrode 28 is also evaporated or sputtered directly onto the lower side of the cover plate 13 and then structured by means of photolithography. Both electrodes, top 28 and bottom 27, are accessible by means of extensions in both substrate and cover plate, as shown.

Variations and modifications are possible without departing from the spirit of the invention.

Each and every one of the appended claims defines an aspect of the invention which is separate and distinct from all others, and accordingly it is intended that each claim be treated in this manner when examined in the light of the prior art devices in any determination of novelty or validity.

What is claimed is:

1. Method to produce nonlinear optical microcomponents comprising the steps of:
   a) producing a waveguide structure from a multilayer resist material by means of X-ray depth lithography, said multilayer resist material having an outside layer, and said X-ray depth lithography producing free spaces in said resist material,
   b) filling the said free spaces with a filler material corresponding to the outside layer of the resist material,
   c) producing by means of X-ray depth lithography, a microcell structure in the area of the waveguide structure, and thereafter,
   d) placing material having nonlinear optical properties into said microcell structure.

2. Method according to claim 1, characterized in that, said waveguide structure has ends, and when producing the microcell structure, the waveguide structure's ends adjacent to the microcell structure are structured at the same time.

3. Method according to claim 1, characterized in that the multilayer resist material comprises three layers.

4. Method according to claim 3, characterized in that the three layers comprise two outside layers and one core layer, and that fluoridated PMMA is used for one outside layer of the three layer resist material and PMMA is used for the core layer.

5. Method to produce nonlinear optical microcomponents having a substrate, comprising the steps of:
   a) producing a microstructure from a resist material, by means of X-ray depth lithography,
   b) generating from the microstructure, by means of electro-forming, a mold insert comprising a polymer material,
   c) producing a waveguide structure and a microstructure containing at least one microcell structure formed by the waveguide structure, by means of molding and with the use of the mold insert,
   d) applying the microstructure to the substrate, and
   e) introducing into the microcell structure, optically nonlinear material.

6. Method to produce active optical microcomponents, comprising the steps of:
   a) producing a microstructure from a resist material by means of X-ray lithography, said microstructure containing waveguide structures and at least one microcell structure therein, and
   b) introducing optically nonlinear material into the microcell structure.

7. Method according to claim 1, characterized in that polymers are used as the nonlinear optical material.

8. Method according to claim 1, characterized in that a cover layer is applied, at least in the area of the nonlinear optical material.

9. Method according to claim 1, characterized in that the nonlinear optical material remains liquid after its introduction into the microcell structure and is locked in by a cover layer.

10. Method according to claim 9, characterized in that the cover layer comprises glass.

11. Method according to claim 1, characterized in that the nonlinear material after its introduction into the microcell structure is stabilized by means of a low temperature plasma treatment.

12. Method according to claim 1, characterized in that the nonlinear optical material is provided with electrodes.

13. Method according to claim 6, characterized in that polymers are used as the nonlinear optical material.

14. Method according to claim 1, characterized in that the nonlinear material after its introduction into the microcell structure is stabilized by means of suitable radiation.

* * * * *